US008702885B2

(12) United States Patent
Matsuda et al.

(10) Patent No.: US 8,702,885 B2
(45) Date of Patent: Apr. 22, 2014

(54) METHOD OF MANUFACTURING CERAMICS AND PIEZOELECTRIC MATERIAL

(75) Inventors: Takanori Matsuda, Chofu (JP); Tatsuo Furuta, Machida (JP); Takayuki Watanabe, Yokohama (JP); Jumpei Hayashi, Chofu (JP); Nobuhiro Kumada, Kofu (JP)

(73) Assignees: Canon Kabushiki Kaisha, Tokyo (JP); University of Yamanashi, Kofu-shi (JP)

( * ) Notice: Subject to any disclaimer, the term of this patent is extended or adjusted under 35 U.S.C. 154(b) by 0 days.

(21) Appl. No.: 13/638,356

(22) PCT Filed: Apr. 15, 2011

(86) PCT No.: PCT/JP2011/059885
§ 371 (c)(1),
(2), (4) Date: Sep. 28, 2012

(87) PCT Pub. No.: WO2011/136131
PCT Pub. Date: Nov. 3, 2011

(65) Prior Publication Data
US 2013/0029181 A1    Jan. 31, 2013

(30) Foreign Application Priority Data
Apr. 27, 2010 (JP) ................. 2010-102699

(51) Int. Cl.
*C03B 29/00* (2006.01)
*H01F 1/00* (2006.01)
*C04B 35/00* (2006.01)
*C03C 10/02* (2006.01)
*H05B 6/00* (2006.01)
*B29C 67/00* (2006.01)

(52) U.S. Cl.
USPC .......... 156/89.11; 501/10; 501/137; 427/547; 264/430; 264/434; 264/436; 264/435; 264/437

(58) Field of Classification Search
USPC .......... 156/89.11; 427/547; 501/10, 137; 264/430, 434, 436, 435, 437; 310/358, 310/311
See application file for complete search history.

(56) References Cited

U.S. PATENT DOCUMENTS 5,169,551 A * 12/1992 Tsunooka et al. ....... 252/62.9 R
6,093,338 A *  7/2000 Tani et al. ............... 252/62.9 R (Continued)

FOREIGN PATENT DOCUMENTS

JP    11-217272 A    8/1999
JP    2004006704 A *  1/2004

OTHER PUBLICATIONS

Yutaka Doshida et al., "Crystal-Oriented La-Substituted Sr2NaNb5O15 Ceramics Fabricated Using High-Magnetic-Field Method," vol. 45, No. 9B Japn. J. Appl. Phys. 7460-7464 (Sep. 2006).

*Primary Examiner* — Philip Tucker
*Assistant Examiner* — Alex Efta
(74) *Attorney, Agent, or Firm* — Fitzpatrick, Cella, Harper & Scinto

(57) ABSTRACT

A method of manufacturing ceramics includes: placing, on a base material, a first slurry in which a metal oxide powder is dispersed; applying a magnetic field to the first slurry to solidify the first slurry, thereby forming an under coat layer made of a first compact; placing, on the under coat layer, a second slurry containing a metal oxide powder constituting the ceramics; applying a magnetic field to the second slurry to solidify the second slurry, thereby forming a second compact to obtain a laminated body of the second compact and the under coat layer; and obtaining the ceramics made of the second compact by removing the under coat layer from the laminated body of the second compact and the under coat layer and then sintering the second compact, or sintering the laminated body of the second compact and the under coat layer and then removing the under coat layer.

9 Claims, 4 Drawing Sheets

(56) References Cited

U.S. PATENT DOCUMENTS

| | | |
|---|---|---|
| 6,517,934 B1* | 2/2003 | Kishimoto .................... 428/323 |
| 2002/0045531 A1* | 4/2002 | Suzuki et al. ................ 501/98.4 |
| 2005/0170149 A1* | 8/2005 | Buczek et al. ................ 428/180 |
| 2005/0287355 A1* | 12/2005 | Matayabas .................... 428/323 |
| 2006/0035114 A1* | 2/2006 | Kuse et al. .................... 428/844 |
| 2011/0193451 A1 | 8/2011 | Watanabe et al. |
| 2011/0297870 A1 | 12/2011 | Matsuda et al. |
| 2011/0298336 A1 | 12/2011 | Saito et al. |

\* cited by examiner

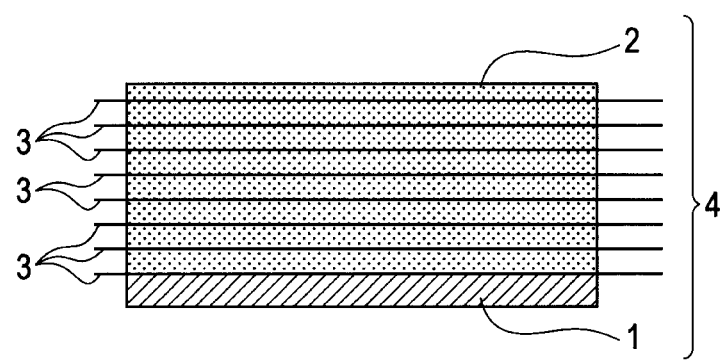
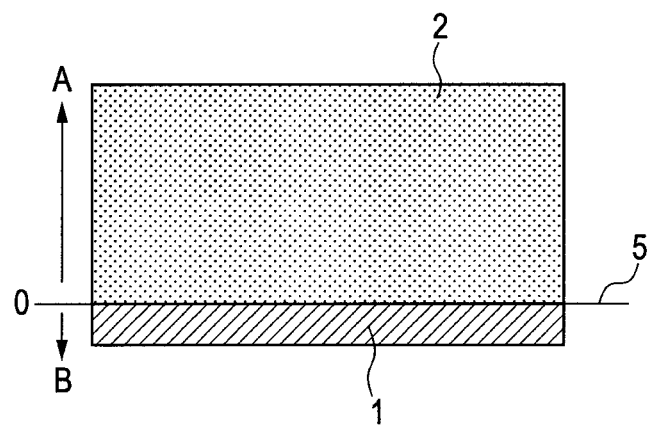

METHOD OF MANUFACTURING CERAMICS AND PIEZOELECTRIC MATERIAL

TECHNICAL FIELD

The present invention relates to a method of manufacturing ceramics and a piezoelectric material, and more particularly, to a method of manufacturing oriented ceramics, and a piezoelectric material made of the ceramics.

BACKGROUND ART

To achieve the orientation of a ceramics, a TGG method and an RTGG method are known. In the TGG method, template grains with high anisotropy are arrayed mechanically or by an external field in advance, followed by reacting with matrix grains made of the same composition as that of the template grains for growth. In the RTGG method, the template grains are subjected to reaction with the matrix grains to obtain the oriented grains having a desired composition. Further, in recent years, with the development of a superconducting magnet device, there is proposed a method in which a strong magnetic field of 10 T is developed so that even grains with not particularly high anisotropy can be oriented. In this method, there is proposed, as the orientation using a magnetic susceptibility anisotropy can be conducted, to obtain a compact oriented in a specific direction by applying a rotating magnetic field during a slip cast to a ferroelectric material and a piezoelectric material of a tungsten bronze structure metal oxide, whose crystal axis is short in functional axis and alignment cannot be performed by a mechanical stress such as one obtained by a doctor blade method, (Patent Literature 1).

As a result of extensive study on the oriented ceramics of the tungsten bronze structure metal oxide, it was found that the higher orientation is required for improving the characteristics as a piezoelectric material. That is, in the case of the tungsten bronze structure metal oxide, most of the compositions each have a polarization axis in a c-axial direction except for some lead based materials, and a non-180° domain such as the piezoelectric material of a perovskite-type metal oxide cannot be formed. Therefore, the orientation in the c-axis is essential.

Further, there was reported that when the tungsten bronze structure metal oxide is oriented, the high anisotropy causes a crack due to the high anisotropic shape. Non-patent Literature 1 discloses that for the purpose of preventing the crack, the high anisotropy is weakened by doping of La to prevent the occurrence of the crack. However, this method suffers from such a problem that the orientation is degraded, and the piezoelectric property is also deteriorated.

CITATION LIST

Patent Literature

PTL 1: Japanese Patent Application Laid-Open No. H11-217272

Non Patent Literature

NPL 1: Japanese Journal of Applied Physics, Vol. 45, No. 9B, 2006, pp. 7460 to 7464

SUMMARY OF INVENTION

Technical Problem

In the case of the orientation by the conventional slip casting method in the strong magnetic field orientation, the orientation is improved by high output of a magnetic field device, resulting in a problem in that the orientation distribution occurs within ceramics, and the crack occurs. As its countermeasure, the anisotropy of the oriented grains is reduced so that a ceramics having no crack can be obtained tentatively. However, in the case of a functional material such as the piezoelectric material of the tungsten bronze structure metal oxide, the anisotropy itself produces the characteristics in many cases, and hence a functional ceramics having no crack while keeping the high orientation by using grains that retain the anisotropy as high as possible is demanded.

Solution to Problem

The present invention has been made in view of the above-mentioned circumstances, and aims at providing a method of manufacturing ceramics excellent in sintering performance, which prevents the occurrence of a crack while keeping the high orientation. Further, the present invention aims at providing a piezoelectric material made of ceramics obtained by the above-mentioned manufacturing method.

A method of manufacturing ceramics for solving the above-mentioned problem includes: placing, on a base material, a first slurry in which a metal oxide powder containing at least metal elements constituting the ceramics is dispersed; applying a magnetic field to the first slurry to solidify the first slurry, thereby forming an under coat layer made of a first compact; placing, on the under coat layer, a second slurry containing a metal oxide powder constituting the ceramics; applying a magnetic field to the second slurry to solidify the second slurry, thereby forming a second compact to obtain a laminated body of the second compact and the under coat layer; and obtaining the ceramics made of the second compact by one of removing the under coat layer from the laminated body of the second compact and the under coat layer and then sintering the second compact, and sintering the laminated body of the second compact and the under coat layer and then removing the under coat layer. Further, the present invention provides a piezoelectric material made of the ceramics obtained by the above-mentioned manufacturing method.

Advantageous Effects of Invention

The present invention can provide the method of manufacturing ceramics excellent in sintering performance, which prevents the occurrence of the crack while keeping the high orientation. Further, the present invention can provide the piezoelectric material made of ceramics obtained by the above-mentioned manufacturing method.

In particular, the present invention can obtain ceramics that has a crystal structure having a high anisotropy such as a tungsten bronze structure metal oxide, generates no crack in a material requiring the orientation when being used as a piezoelectric material, and is high in piezoelectricity and high in homogeneity.

Further, the manufacturing method according to the present invention is not limited to the piezoelectric material, but can be used in manufacturing various other functional ceramic materials.

Further features of the present invention will become apparent from the following description of exemplary embodiments with reference to the attached drawings.

BRIEF DESCRIPTION OF DRAWINGS

FIG. 2 is a schematic side view of a disc sintered body in which a laminated body of a second compact and an under coat layer is sintered in the present invention.

FIG. 3 is a schematic side view of the sintered body in which the laminated body of the second compact and the under coat layer is sintered in the present invention.

DESCRIPTION OF EMBODIMENTS

Hereinafter, an embodiment of the present invention is described in detail. In the following description, the embodiment is described as a piezoelectric material, but may be used for another purpose. The manufacturing method of the present invention is preferably used as the method of manufacturing the piezoelectric material, but is not used only as the method of manufacturing the piezoelectric material.

The method of manufacturing ceramics according to the present invention includes: placing, on a base material, a first slurry in which a metal oxide powder containing at least metal elements constituting the ceramics is dispersed; applying a magnetic field to the first slurry to solidify the first slurry, thereby forming an under coat layer made of a first compact; placing, on the under coat layer, a second slurry containing a metal oxide powder constituting the ceramics; applying a magnetic field to the second slurry to solidify the second slurry, thereby forming a second compact to obtain a laminated body of the second compact and the under coat layer; and obtaining the ceramics made of the second compact by one of removing the under coat layer from the laminated body of the second compact and the under coat layer and then sintering the second compact, and sintering the laminated body of the second compact and the under coat layer and then removing the under coat layer.

Figure 1:
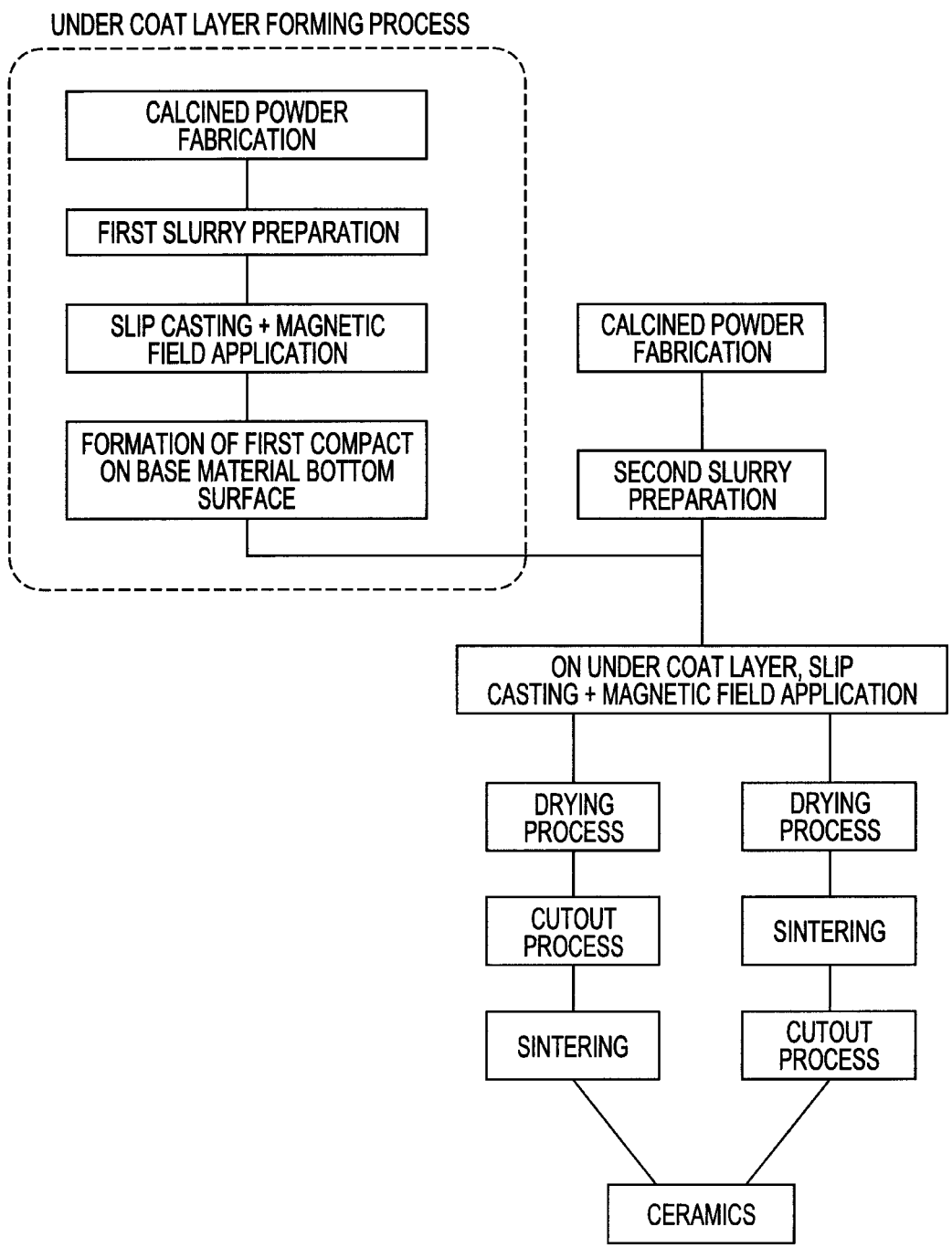
FIG. 1 is a process chart illustrating a method of manufacturing ceramics according to one embodiment of the present invention.

FIG. 1 is a process chart illustrating a method of manufacturing ceramics according to one embodiment of the present invention. As illustrated in FIG. 1, the method of manufacturing ceramics according to the present invention performs: a process of preparing a first slurry in which metal oxide powders containing at least metal elements constituting the ceramics are dispersed, and placing the first slurry on a base material through a slip casting method; and a process of applying a magnetic field to the first slurry for solidification to form an under coat layer made of a first compact.

Subsequently, the method performs: a process of preparing a second slurry containing metal oxide powders constituting the ceramics, and placing the second slurry on the under coat layer through the slip casting method; and a process of applying the magnetic field to the second slurry for solidification to form a second compact followed by drying, thereby obtaining a laminated body of the second compact and the under coat layer.

Subsequently, the method performs: a process of removing the under coat layer from the laminated body of the second compact and the under coat layer through a cutout process and then sintering the second compact, or sintering the laminated body of the second compact and the under coat layer and then removing the under coat layer through the cutout process, to thereby obtain ceramics made of the second compact.

In the manufacturing method of the present invention, an anisotropic metal oxide having a tungsten bronze structure, a perovskite structure, a spinel structure, a garnet structure, a hexagonal crystal structure, or the like may be used for the metal oxide powder as a raw material of the ceramics. The powder has an average particle diameter of preferably 10 nm or more to 10 μm or less.

Examples of the metal oxide powder as the raw material include barium titanate, lead zirconate titanate, $Sr_{1-x}Ba_x Nb_2O_6$, $MgAl_2O_4$, $Y_3Al_5O_{12}$, and GaN. Further, the compositions of metal oxide powders to be contained in the first slurry and the second slurry may be identical to or different from each other.

It is preferred that a solvent used for the slurry in the present invention be water. It is preferred that the concentration of the metal oxide powders to the solvent be equal to or higher than 10 wt % and equal to or lower than 80 wt %. If the concentration is lower than 10 wt %, it takes time to dry. If the concentration is higher than 80 wt %, the viscosity becomes so high that the powders of the slurry cannot be sufficiently dispersed, and the orientation cannot be performed.

As a method of dispersing the metal oxide powder, a ball mill or a bead mill is used.

It is preferred that the base material be recessed for the purpose of bringing the placed slurry into a desired shape after the slurry is solidified. Further, it is preferred that the base material be made of a material that absorbs the solvent in order to accelerate drying. In particular, it is preferred that the base material of the present invention be a plaster. It is preferred that the slurry be softly poured into a recess formed in the base material as the base material placing method.

For the magnetic field to be applied to the slurry, it is preferred that a superconducting magnet device be used to apply a magnetic field equal to or higher than 1 T and equal to or lower than 20 T. It is more preferred that the magnetic field be equal to or higher than 10 T and equal to or lower than 20 T. In the method of obtaining the compact, it is preferred that the slurry solidified by the base material be naturally dried at room temperature. It is preferred that the drying temperature be lower than 40° C. The heat drying of 60° C. or higher by a dryer is not preferred because a crack is liable to occur in the compact. The crack as defined in the present invention is a large crack that can be visually checked. If the crack exists in the ceramics of the functional material, there arises such a problem that not only the function itself but also the mechanical strength is deteriorated.

Further, the under coat layer made of the first compact is produced in the present invention. The second compact is formed on the under coat layer to obtain the laminated body of the second compact and the under coat layer. The under coat layer functions to generate a boundary surface between the under coat layer and the compact made of the second slurry, to thereby confine a stress into the under coat layer, which is finally made redundant, because a shear force caused by a contraction difference occurring in a drying process and a sintering process is concentrated in the under coat layer. For that reason, it is preferred that the under coat layer be solidified once before the second slurry is poured into the under coat layer. Even if the compact made of the first slurry which forms the under coat layer and the compact made of the second slurry are made of the same material system, the boundary surface becomes a boundary surface where the stress is discontinuous.

In the method of removing the under coat layer, the laminated body of the second compact and the under coat layer may be cut by a blade to remove the under coat layer before sintering, or the under coat layer may be removed by the blade or a grinding device after sintering.

In the manufacturing method according to the present invention, it is preferred that the metal oxide powder of the first slurry have a magnetic anisotropy. The magnetic anisotropy is caused by a difference in the magnetic susceptibility of the crystal structure in all orientations, and caused by a large aspect ratio of a unit cell of crystal, or the arrangement or combination of constituent elements. Examples of the metal oxide powder having a large aspect ratio of the unit cell of crystal include alumina or a bismuth layer compound. An example of the metal oxide powder affected by the arrangement or combination of the constituent elements includes ferrite. It is preferred that the metal oxide powder contain a magnetic metal element. The magnetic metal may be Fe, Co, Ni, Gd, Tb, Dy, Ho, Er, or Tm. It is preferred that the content of the magnetic metal be equal to or higher than 0.05 wt % and equal to or lower than 10 wt % with respect to the metal oxide powder, which prevents the function.

Further, it is preferred that the metal oxide powder of the first slurry contain Mn. The Mn element per se is not a ferromagnetic element, but has a magnetic moment when contained as oxide. However, the Mn element is smaller in magnetic property than ferrite made of the ferromagnetic body. For that reason, the Mn element can be sufficiently handled even in a strong magnetic field of 10 T.

Further, in the manufacturing method according to the present invention, it is preferred that the first compact and the second compact be oriented in the same crystal axis. In the same crystal axis, a history of the orientation is excellently taken over from the first compact to the second compact. In order to provide the same crystal axis, a magnetic field direction of the first compact should match a magnetic field direction of the second compact. The direction of the oriented crystal axis may be <001>, <100>, <110>, <101>, or <111>.

Further, in the manufacturing method according to the present invention, it is preferred that the ceramics be a tungsten bronze structure metal oxide.

Examples of the tungsten bronze structure include $(SrCa)_4Na_2Nb_{10}O_{30}$, $Ba_4Bi_{2/3}Nb_{10}O_{30}$, and $(SrBa)_5Nb_{10}O_{30}$ as well as $(BaCa)_5Bi_{2/3}Nb_{10}O_{30}$. Preferred are $(BaCa)_5Bi_{2/3}Nb_{10}O_{30}$ and $(SrCa)_4Na_2Nb_{10}O_{30}$. In the tungsten bronze structure metal oxide, most of the compositions have a polarization axis which is in a c-axial direction except some lead based materials, and non-180° domain cannot be formed, and hence the orientation in the c-axis is essential. Therefore, because the orientation of the tungsten bronze structure metal oxide having a flat shape is not sufficient in a mechanical manner such as the doctor blade method, it is preferred to use a magnetic field orientation method using the magnetic anisotropy due to the flat shape.

Further, in the manufacturing method according to the present invention, it is preferred that the ceramics be a perovskite-type metal oxide. Examples of the perovskite structure include lead-based perovskite structures such as $PbZrTiO_3$ and $Pb(MgNb)TiO_3$, simple perovskite structures such as $KaNaNbO_3$ and $Bi_{1/2}Na_{1/2}TiO_3$, and layered perovskite structures such as $Bi_4Ti_8O_{12}$ as well as barium titanate $BaTiO_3$. In the perovskite-type metal oxide, the simple perovskite structure is small in the anisotropy, and the orientation is difficult. Further, in particular, in the mechanical manner such as the doctor blade method, because anisotropy is short in the powder shape, the orientation is very difficult. On the contrary, with the recent development of the magnetic field device, in the magnetic field orientation method, the powders can be arranged by the strong magnetic field of 10 T, even if the anisotropy is short. Further, in the simple perovskite structure, because the functional axis is equal to the axis that accelerates the arrangement due to the magnetic field, the magnetic field orientation method is proper. It is preferred that a main component of the perovskite-type metal oxide be barium titanate $BaTiO_3$. Barium titanate $BaTiO_3$ is shorter in the anisotropy of the structure than $PbZrTiO_3$ which is representative of the same piezoelectric material. For that reason, in particular, it is preferred that the magnetic field orientation be applied rather than the mechanical manner.

Further, in the manufacturing method according to the present invention, it is preferred that the magnetic field for the first slurry be a rotating magnetic field. In particular, in the case of the tungsten bronze structure metal oxide having a structure in which a- and b-axes are longer than the c-axis, it is preferred that the c-axial orientation be performed by the rotating magnetic field. This mechanism can be described by a characteristic structure in which the unit cell of the tungsten bronze structure metal oxide has the a- and b-axes longer than the c-axis. The magnetic susceptibility of the tungsten bronze structure metal oxide made of a non-magnetic material is larger in a direction of the longer crystal axis. For that reason, when the magnetic field is simply applied to the stationary slurry, the tungsten bronze structure metal oxide has the a- and b-axes parallel to the magnetic field direction. In this example, when the slurry is placed on a rotary table, the magnetic field is applied to the slurry from a circumferential direction thereof, that is, a rotating magnetic field is applied to the slurry, and the a- and b-axial directions are oriented in the circumferential direction to a direction perpendicular to the magnetic field direction. For that reason, the c-axial direction, which is a component substantially perpendicular to the a- and b-axial directions, is aligned in one direction. With the above-mentioned mechanism, when the rotating magnetic field is applied to the tungsten bronze structure metal oxide, the metal oxide is oriented in a direction perpendicular to the magnetic field direction, which is the c-axis as a functional axis of the tungsten bronze structure metal oxide, that is, a <001> direction.

The manufacturing method according to the present invention realizes the uniform orientation of ceramics. FIG. 2 is a schematic side view of a disc sintered body in which the laminated body of the second compact and the under coat layer (first compact) is sintered in the present invention. In order to evaluate the uniformity of the orientation, as illustrated in FIG. 2, before the process of removing the under coat layer, the orientation distribution in the thickness direction of a second compact 2 was evaluated as illustrated by cut cross sections 3 while θ-2θ measurement of an X-ray diffraction measurement and grinding were sequentially repetitively performed on a sintered disc sintered body 4 from a plane in which a first compact (under coat layer) 1 contacted the base material. The results of evaluating the uniformity of the orientation are illustrated specifically in FIG. 4 of Example 1.

A method of calculating a Lotgering factor representing the degree of orientation is calculated through Equation 1 by using an integral peak intensity of X-rays diffracted from a crystal face intended for data obtained from the θ-2θ measurement of the X-ray diffraction measurement.

$$F=(\rho-\rho_0)/(1-\rho_0) \quad \text{(Equation 1)}$$

where $\rho_0$ is calculated by using the diffraction intensity (I0) of the X-ray of the non-oriented sample.

In the case of the c-axial orientation, $\rho_0$ is obtained from Equation 2 as a ratio of the total of the diffraction intensities of a (001) plane (all planes perpendicular to the c-axis) to a sum of all the diffraction intensities.

$$\rho_0=\Sigma I_0(001)/\Sigma I_0(hkl) \quad \text{(Equation 2)}$$

where ρ is calculated by using the diffraction intensity (I) of X-rays of the orientated sample. In the case of the c-axial orientation, obtained by Equation 3 similarly to Equation 2 as a ratio of the total of the diffraction intensities of the (001) plane to a sum of all the diffraction intensities.

$$\rho_0 = \Sigma I(001)/\Sigma I(hkl) \quad \text{(Equation 3)}$$

Further, the present invention provides a piezoelectric material made of ceramics obtained by the above-mentioned manufacturing method. The ceramic of the present invention is useful as a piezoelectric material.

EXAMPLE 1

A piezoelectric material of a tungsten bronze structure metal oxide (1−x)CBN−xBBN (0≤x≤1), where x=0.75, was produced. CBN represents $Ca_{1.4}Ba_{3.6}Nb_{10}O_{30}$ and BBN represents $Ba_4Bi_{0.67}Nb_{10}O_{30}$. As raw materials, barium carbonate, calcium carbonate, bismuth oxide, and niobium oxide powders were used and dry mixed together with a mortar in a predetermined mixing ratio.

Calcination was performed by placing the mixed powder in an alumina crucible and sintering it using an electric furnace in air at 950° C. for 5 hours. Then, the mixed powder was crushed with a mortar and placed again in the alumina crucible, and sintered using the electric furnace in air at 1,100° C. for 5 hours.

In the preparation of the slurry, the powders obtained by the above-mentioned calcination, pure water, and a dispersant (trade name: Dispersant 5020, produced by San Nopco Limited) were mixed at 2 wt % together with the first slurry and the second slurry, and a dispersion treatment was performed by using a pot mill for 24 hours or longer. In this example, for checking the dispersed state, a dynamic light-scattering photometer (Zeta Sizer produced by Sysmex Corporation) was used to measure a particle diameter. As a result of the measurement, an average particle diameter was about 900 nm. In this case, the average particle diameter is preferably 100 nm or more to 2 μm or less.

For a magnetic field treatment, a superconducting magnet (JMTD-10T180 produced by Japan Superconductor Technology, Inc.) was used. A magnetic field of 10 T was generated by the superconducting magnet, and a table was rotated at 30 rpm in the vertical direction to the magnetic field direction using a non-magnetic ultrasonic motor capable of rotation driving in a magnetic field.

First, plaster to become a base material was statically placed on the table of the magnetic field device, and during rotation driving, a small amount of the first slurry was poured into the plaster on the table, and thereafter solidified to some degree, to thereby form the under coat layer made of the first compact through the slip casting method.

Then, on the table of the magnetic field device, the second slurry was poured into the plaster having the under coat layer, and molded through the slip casting method to form the second compact. In the formation of the compact made of the laminated body including the second compact and the under coat layer, the inside of the plaster was dried all night and all day after treatment through the slip casting method, and die cutting was performed from the plaster. Thereafter, a heat treatment was performed within a closed container at 45° C. for 24 hours. Thereafter, the compact was dried in air for one week.

The surface and the under coat layer of the dried compact were removed by using a blade saw to obtain the disc-shaped second compact.

The second compact thus obtained was sintered using the electric furnace in air at 1,300° C. to 1,350° C. for 6 hours. Here, the density of the obtained sintered body was evaluated by the Archimedes' method. Further, the obtained sintered body was subjected to structure analysis by XRD (X-ray diffraction) and composition analysis by fluorescent X-ray analysis after the surface was cut.

Further, the sintered disc-shaped tungsten bronze structure metal oxide was polished to a thickness of 1 mm. After that, an Au electrode was formed with a thickness of 500 μm on both surfaces using a sputtering apparatus, and cut to 2.5 mm×10 mm using a cutting apparatus to obtain a piezoelectric element for evaluating electric characteristics.

The polarization treatment was performed at a temperature of 160° C. and an applied electric field of 20 kV/cm for an application period of 10 minutes. The state of polarization was checked by a resonance-antiresonance method. The piezoelectric characteristics were evaluated using a $d_{33}$ meter (Piezo Meter System produced by PIEZOTEST).

Figure 4:
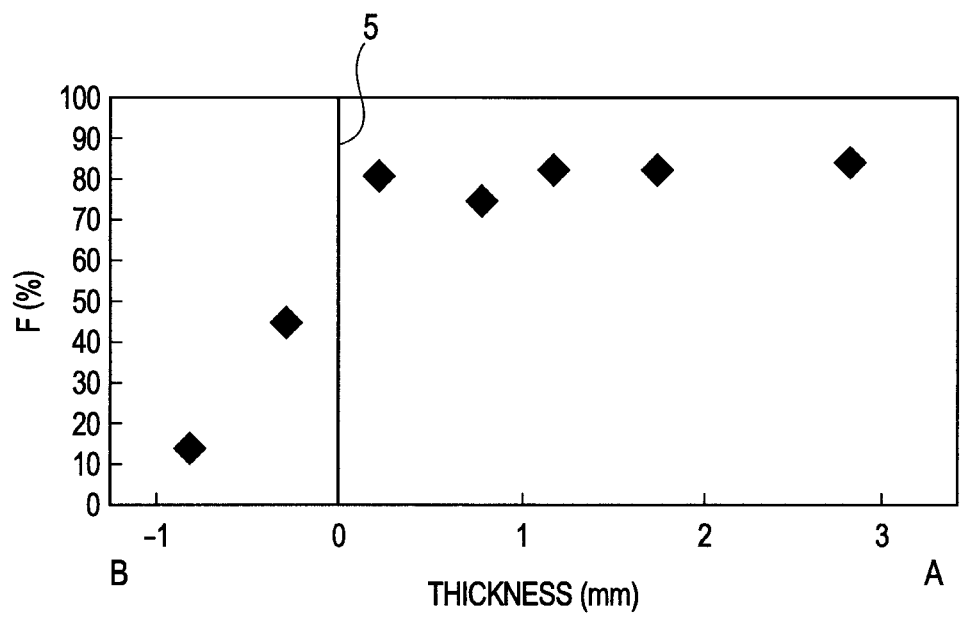
FIG. 4 is a graph illustrating an orientation distribution of the sintered body in which the laminated body of the second compact and the under coat layer is sintered in Example 1 of the present invention.

Subsequently, the orientation distribution of the compact made of the laminated body including the second compact and the under coat layer is described. FIG. 3 is a schematic side view of the sintered body in which the laminated body of the second compact and the under coat layer is sintered in the present invention. FIG. 4 is a graph illustrating an orientation distribution of the oriented tungsten bronze structure metal oxide obtained by sintering the laminated body of the second compact and the under coat layer.

In FIG. 4, the axis of ordinate is a Lotgering factor F indicative of the degree of orientation, and the axis of abscissa is a thickness of the sintered body. As illustrated in FIG. 3, a boundary surface 5 between the first compact 1 and the second compact 2 represents a reference point 0, a plus side A is a distance from the boundary surface 5 to a surface of the second compact 2, and a minus side B is a distance from the boundary surface 5 to a bottom surface of the first compact 1.

Further, the results of a relative density, $d_{33}$, the uniformity of the sample, and the outer appearance of the tungsten bronze structure metal oxide are shown in Table 1 to be described later.

EXAMPLE 2

As for the second slurry, a piezoelectric material of a tungsten bronze structure metal oxide (1−x)CBN−xBBN (0≤x≤1), where x=0.75, was produced. CBN represents $Ca_{1.4}Ba_{3.6}Nb_{10}O_{30}$ and BBN represents $Ba_4Bi_{0.67}Nb_{10}O_{30}$. As raw materials, barium carbonate, calcium carbonate, bismuth oxide, and niobium oxide powders were used and dry mixed together with a mortar in a predetermined mixing ratio.

Further, as for the first slurry, a piezoelectric material of a tungsten bronze structure metal oxide (1−x)CBN−xBBN (0≤x≤1), where x=0.75, with Mn added was produced. As raw materials, manganese oxide, barium carbonate, calcium carbonate, bismuth oxide, and niobium oxide powders were used and dry mixed together with a mortar in a predetermined mixing ratio. The amount of manganese oxide is 0.4 wt % in terms of metal manganese. It should be noted that the amount of manganese oxide is preferably 0.1 wt % or more to 10 wt % or less, more preferably 0.3 wt % or more to 5 wt % or less in terms of metal manganese.

Calcination was performed in the same way for the above-mentioned two compositions.

First, calcination was performed by placing the mixed powder in an alumina crucible and sintering it using an electric furnace in air at 950° C. for 5 hours. Then, the mixed powder was crushed with a mortar and placed again in the alumina crucible, and sintered using the electric furnace in air at 1100° C. for 5 hours.

A slurry was prepared in the same way for the above-mentioned two calcined powders. First, the powders obtained by the calcination, pure water, and a dispersant were mixed at 2 wt %, and a dispersion treatment was performed by using a pot mill for 24 hours or longer. Here, for checking the dispersed state, a particle diameter was measured using a dynamic light-scattering photometer (Zeta Sizer produced by Sysmex Corporation). As a result of the measurement, the particle average diameter in the two kinds of slurries was about 950 nm. In this case, the particle average diameter is preferably 100 nm or more to 2 µm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in the vertical direction to the magnetic field direction using a non-magnetic ultrasonic motor capable of rotation driving in a magnetic field.

First, plaster to become a base material was statically placed on the table of the magnetic field device, and during rotational driving, a small amount of the first slurry added with Mn was poured into the plaster on the table, and thereafter solidified to some degree, to thereby form the under coat layer made of the first compact through the slip casting method.

Then, on the table of the magnetic field device, the second slurry without Mn added was poured into the plaster having the under coat layer, to thereby form the second compact through the slip casting method.

In the formation of the compact under the same conditions as that of Example 1, the inside of the plaster was dried all night and all day after treatment through the slip casting method, and die cutting was performed from the plaster. Thereafter, a heat treatment was performed within a closed container at 45° C. for 24 hours. Thereafter, the compact was dried in air for one week.

The surface and the under coat layer of the dried compact were removed by using a blade saw under the same conditions as that of Example 1 to obtain the disc-shaped second compact. The second compact thus obtained was sintered under the same conditions as that of Example 1 using the electric furnace in air at 1300° C. to 1350° C. for 6 hours. Here, the density of the obtained sintered body was evaluated by the Archimedes' method. Further, the obtained sintered body was subjected to structure analysis by XRD (X-ray diffraction) and composition analysis by fluorescent X-ray analysis after the surface was cut.

Further, as in Example 1, the sintered disc-shaped tungsten bronze structure metal oxide was polished to a thickness of 1 mm. After that, an Au electrode was formed with a thickness of 500 µm on both surfaces using a sputtering apparatus, and cut to 2.5 mm×10 mm using a cutting apparatus to obtain a piezoelectric material for evaluating electric characteristics.

The polarization treatment was performed at a temperature of 160° C. and an applied electric field of 20 kV/cm for an application period of 10 minutes. The state of polarization was checked by a resonance-antiresonance method. The piezoelectric characteristics were evaluated using a $d_{33}$ meter (Piezo Meter System produced by PIEZOTEST).

Figure 5:
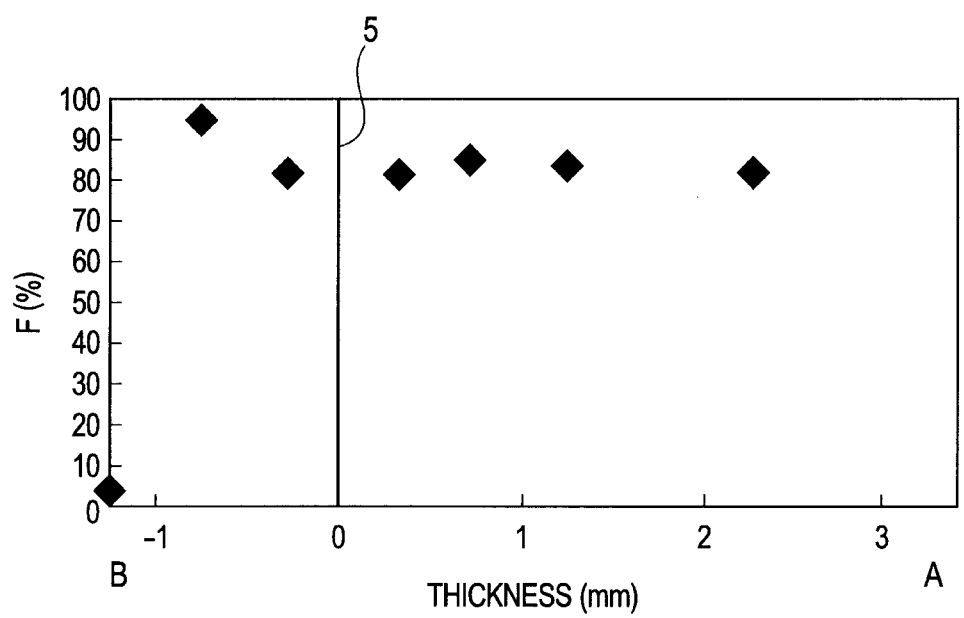
FIG. 5 is a graph illustrating an orientation distribution of the sintered body in which the laminated body of the second compact and the under coat layer is sintered in Example 2 of the present invention.

FIG. 5 is a graph illustrating an orientation distribution of the thus obtained oriented tungsten bronze structure metal oxide. In FIG. 5, the axis of ordinate is a Lotgering factor F indicative of the degree of orientation, and the axis of abscissa is a thickness of the sintered body. A boundary surface between the first compact and the second compact represents a reference point 0, a plus side A is a distance from the boundary surface to a surface of the second compact, and a minus side B is a distance from the boundary surface to a bottom surface of the first compact.

Further, the results of a relative density, $d_{33}$, the uniformity of the sample, and the outer appearance of the tungsten bronze structure metal oxide are shown in Table 1.

EXAMPLE 3

A piezoelectric material of a barium titanate perovskite-type metal oxide $BaTiO_3$ was produced. As raw materials, barium carbonate and titanium oxide were dry mixed together with a mortar in a predetermined mixing ratio. Calcination was performed by placing the mixed powder in an alumina crucible and sintering it using an electric furnace in air at 1,200° C. for 5 hours. Then, the mixed powder was crushed with a mortar and placed again in the alumina crucible, and sintered using the electric furnace in air at 1,200° C. for 5 hours.

In the preparation of the slurry, the powders obtained by the above-mentioned calcination, pure water, and a dispersant were mixed at 2 wt % together with the first slurry and the second slurry, and a dispersion treatment was performed by using a pot mill for 24 hours or longer. Further, the calcined powders to be used may be $BaTiO_3$ obtained through hydrothermal synthesis having an average particle diameter of about 1 µm or less. In this example, for checking the dispersed state, a dynamic light-scattering photometer (Zeta Sizer produced by Sysmex Corporation) was used to measure a particle diameter. As a result of the measurement, an average particle diameter was about 100 nm. In this case, the average particle diameter is preferably 30 nm or more to 1 µm or less.

For magnetic field treatment, a superconducting magnet (JMTD-10T180 produced by Japan Superconductor Technology, Inc.) was used. A magnetic field of 10 T was generated by the superconducting magnet, and plaster to become a base material was statically placed on a table of a magnetic field device. Then, a small amount of the first slurry was poured into the plaster on the table, and thereafter solidified to some degree, to thereby form the under coat layer made of the first compact through the slip casting method.

Then, on the table of the magnetic field device, the second slurry was poured into the plaster having the under coat layer, and molded through the slip casting method to form the second compact. In the formation of the compact, the inside of the plaster was dried all night and all day after treatment through the slip casting method, and die cutting was performed from the plaster. Thereafter, a heat treatment was performed within a closed container at 45° C. for 24 hours. Thereafter, the compact was dried in air for one week.

The surface and the under coat layer of the dried compact were removed by using a blade saw to obtain the disc-shaped second compact. The compact thus obtained was sintered using the electric furnace in air at 1,300° C. to 1,400° C. for 2 hours. Here, the density of the obtained sintered body was evaluated by the Archimedes' method. Further, the obtained sintered body was subjected to structure analysis by XRD (X-ray diffraction) and composition analysis by fluorescent X-ray analysis after the surface was cut.

Further, the sintered disc-shaped perovskite-type metal oxide $BaTiO_3$ was polished to a thickness of 1 mm. After that, an Au electrode was formed with a thickness of 500 µm on both surfaces using a sputtering apparatus, and cut to 2.5 mm×10 mm using a cutting apparatus to obtain a piezoelectric element for evaluating electric characteristics.

The polarization treatment was performed at a temperature of 100° C. and an applied electric field of 10 kV/cm for an application period of 30 minutes. The state of polarization was checked by a resonance-antiresonance method. The piezoelectric characteristics were evaluated using a $d_{33}$ meter (Piezo Meter System produced by PIEZOTEST). Table 2 below shows the results of a relative density, degree of orientation, $d_{33}$, and the sample outer appearance of the obtained piezoelectric material.

EXAMPLE 4

A piezoelectric material of a barium titanate perovskite-type metal oxide $BaTiO_3$ was produced. As raw materials, barium carbonate and titanium oxide were dry mixed together with a mortar in a predetermined mixing ratio. Further, the materials to be used may be barium titanate $BaTiO_3$ obtained through hydrothermal synthesis having an average particle diameter of about 1 μm or less.

Calcination was performed by placing the mixed powder in an alumina crucible and sintering it using an electric furnace in air at 1,200° C. for 5 hours. Then, the mixed powder was crushed with a mortar and placed again in the alumina crucible, and sintered using the electric furnace in air at 1,200° C. for 5 hours.

Further, calcined powder for the first slurry was mixed with manganese oxide, and sintered. In this situation, the amount of manganese oxide is 0.4 wt % in terms of metal manganese. The amount of manganese oxide is preferably equal to or higher than 0.1 wt %, and equal to or lower than 10 wt %, and more preferably equal to or higher than 0.3 wt %, and equal to or lower than 5 wt % in terms of metal manganese.

A slurry was prepared by mixing the powder obtained by the calcination, pure water, and a dispersant at 2 wt %, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, the particle average diameter was about 100 nm. The particle average diameter is preferably 30 nm or more to 1 μm or less.

For magnetic field treatment, a superconducting magnet (JMTD-10T180 produced by Japan Superconductor Technology, Inc.) was used. A magnetic field of 10 T was generated by the superconducting magnet, and plaster to become a base material was statically placed on a table of a magnetic field device. Then, a small amount of the first slurry was poured into the plaster on the table, and thereafter solidified to some degree, to thereby form the under coat layer made of the first compact through the slip casting method.

Then, on the table of the magnetic field device the second slurry was poured into the plaster having the under coat layer, and molded through the slip casting method to form the second compact. In the formation of the compact, the inside of the plaster was dried all night and all day after treatment through the slip casting method, and die cutting was performed from the plaster. Thereafter, a heat treatment was performed within a closed container at 45° C. for 24 hours. Thereafter, the compact was dried in air for one week.

The surface and the under coat layer of the dried compact were removed by using a blade saw to obtain the disc-shaped second compact. The second compact thus obtained was sintered using the electric furnace in air at 1,300° C. to 1,400° C. for 2 hours. Here, the density of the obtained sintered body was evaluated by the Archimedes' method. Further, the obtained sintered body was subjected to structure analysis by XRD (X-ray diffraction) and composition analysis by fluorescent X-ray analysis after the surface was cut.

Further, the sintered disc-shaped perovskite-type metal oxide $BaTiO_3$ was polished to a thickness of 1 mm. After that, an Au electrode was formed with a thickness of 500 μm on both surfaces using a sputtering apparatus, and cut to 2.5 mm×10 mm using a cutting apparatus to obtain a piezoelectric element for evaluating electric characteristics.

The polarization treatment was performed at a temperature of 100° C. and an applied electric field of 10 kV/cm for an application period of 30 minutes. The state of polarization was checked by a resonance-antiresonance method. The piezoelectric characteristics were evaluated using a $d_{33}$ meter (Piezo Meter System produced by PIEZOTEST). Table 2 shows the results of the relative density, the degree of orientation, $d_{33}$, and sample outer appearance of the obtained piezoelectric material.

COMPARATIVE EXAMPLE 1

A piezoelectric material of a tungsten bronze structure metal oxide (1−x)CBN−xBBN (0≤x≤1), where x=0.75, was produced. CBN represents $Ca_{1.4}Ba_{3.6}Nb_{10}O_{30}$ and BBN represents $Ba_4Bi_{0.67}Nb_{10}O_{30}$. As raw materials, barium carbonate, calcium carbonate, bismuth oxide, and niobium oxide powders were used and dry mixed with a mortar in a predetermined mixing ratio. The calcination, the preparation of the slurry, the sintering, the production of an electric characteristic evaluation sample, and the polarization treatment were performed in the same manner as that of Example 1. In Comparative Example 1, no magnetic field treatment was performed, and in the preparation of the compact, the prepared slurry was poured into the statically placed plaster on the table, and left for about 20 minutes.

Figure 6:
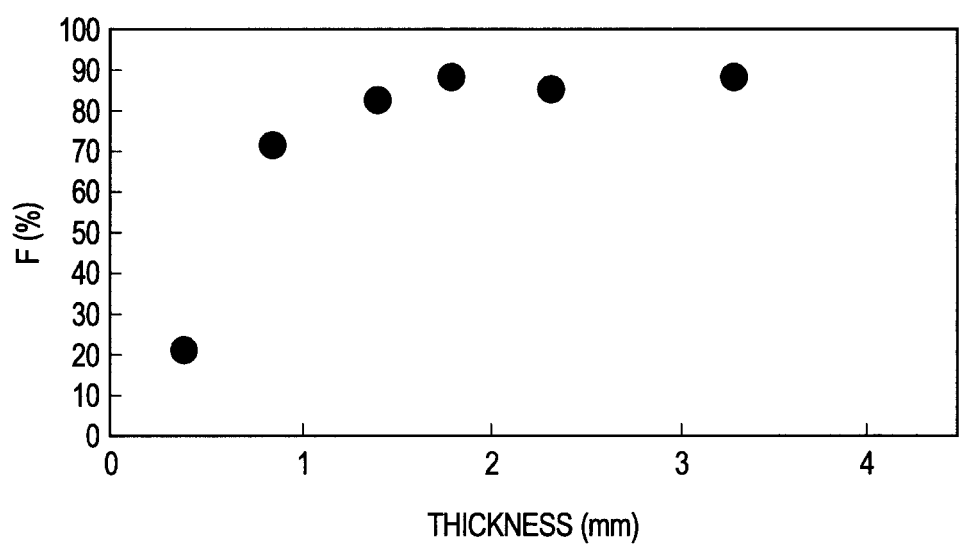
FIG. 6 is a graph illustrating an orientation distribution of a sintered body in Comparative Example 1.

FIG. 6 is a graph illustrating an orientation distribution of the thus obtained oriented tungsten bronze structure metal oxide. In FIG. 6, the axis of ordinate is a Lotgering factor F indicative of the degree of orientation, and the axis of abscissa is a thickness of the sintered body, and represents the distance from the bottom surface to the surface direction. Further, the results of a relative density, $d_{33}$, the uniformity of the sample, and the outer appearance of the tungsten bronze structure metal oxide are shown in Table 1.

COMPARATIVE EXAMPLE 2

A piezoelectric material of a perovskite-type metal oxide $BaTiO_3$ was produced. As raw materials, barium carbonate and titanium oxide were dry mixed together with a mortar in a predetermined mixing ratio.

The calcination, the preparation of the slurry, the sintering, the production of an electric characteristic evaluation sample, and the polarization treatment were performed in the same manner as that of Example 3. In Comparative Example 2, no magnetic field treatment was performed, and in the preparation of the compact, the prepared slurry was poured into the statically placed plaster on the table, and left for about 20 minutes. Table 2 shows the results of the composition, relative density, degree of orientation, and $d_{33}$ of the obtained piezoelectric material.

COMPARATIVE EXAMPLE 3

A piezoelectric material of a barium titanate perovskite-type metal oxide $BaTiO_3$ was produced. As raw materials, barium carbonate and titanium oxide were dry mixed together with a mortar in a predetermined mixing ratio. Calcination was performed by placing the mixed powder in an alumina crucible and sintering it using an electric furnace in air at 1,200° C. for 5 hours. Then, the mixed powder was crushed with a mortar and mixed again with manganese oxide in the alumina crucible, and thereafter sintered using the electric furnace in air at 1,300° C. for 5 hours. The preparation of the slurry, the sintering, the production of an electric characteristic evaluation sample, and the polarization treatment were performed in the same manner as that of Example 3. In Comparative Example 3, no magnetic field treatment was performed, and in the preparation of the compact, the prepared slurry was poured into the statically placed plaster on the table, and left for about 20 minutes.

Table 2 shows the results of the degree of orientation, $d_{33}$, and sample appearance of the obtained piezoelectric material.

TABLE 1

| | Relative density (%) | $d_{33}$ (pC/N) | Uniformity | Outer appearance |
|---|---|---|---|---|
| Example 1 | 99.1 | 90.2 | Good | Good |
| Example 2 | 99.2 | 87.4 | Excellent | Good |
| Comparative Example 1 | 98.7 | 88.9 | No good | No good |

Table 1 shows results of the relative density, $d_{33}$, the sample uniformity, and the outer appearance of the tungsten bronze structure metal oxide in each of Examples 1 and 2, and Comparative Example 1.

In this example, classifications indicative of the uniformity are performed in the uniformity evaluation study. "Good" represents that the degree of orientation of the sintered body in a region of being made by the second slurry having a desired composition is aligned in the thickness direction. "Excellent" represents that the degree of orientation of the sintered body in a region of being made by the second slurry having a desired composition is aligned in the thickness direction, and that the degree of orientation is aligned also on the boundary surface. "No good" represents that the degree of orientation of the sintered body having a desired composition is inclined in the thickness direction.

Further, in the outer appearance, "no good" represents that a crack is visually observed, and "good" represents that no crack occurs. The crack in question is about several mm in size. In this example, the uniformity evaluation study was specifically performed by the following method. As illustrated in a side view of the disc sintered body in FIG. 2, the distribution in the thickness direction was evaluated while θ-2θ measurement of an X-ray diffraction measurement and grinding were sequentially repetitively performed at intervals of 5 mm on the sintered ceramics from a plane in which the first slurry contacted the base material. As a result, the results of Examples 1 and 2 are as illustrated in FIGS. 4 and 5, respectively. On the contrary, the results of Comparative Example 1 that is the conventional art are illustrated in FIG. 6. Referring to FIG. 6, it is found that the inclination of the orientation is continuous from the fact that the degree of orientation F=20% in the vicinity of the bottom surface, the degree of orientation F=70% after the surface is ground by 0.5 mm, the degree of orientation F=80% after the surface is further ground by 0.5 mm, the degree of orientation F=90% after the surface is still further ground by 0.5 mm, and after that, the degree of orientation is constantly held to F=90%. As shown in Table 1, in Comparative Example 1 of the conventional art, although the degree of orientation was high, the degree of orientation was not uniform, and cracks further occurred. This cause is supposed as follows.

In the manufacturing method of Comparative Example 1, immediately after the slurry was slip cast under application of a magnetic field, grains in the slurry were solidified on the bottom surface while the grains were not sufficiently oriented. However, this restriction was eased as the thickness increased, and the grains that were oriented were gradually aligned. As a result, the inclination of the orientation continuously occurred from the bottom surface to the top surface. Further, it is conceivable that, when the compact thus obtained is subjected to the drying process and the sintering process, particularly if crystal anisotropy is high as with the tungsten bronze structure metal oxide used in Comparative Example 1, a contraction difference increases between an internal portion in which the orientation is high and a bottom surface portion in which the orientation is low, with the result that a large stress occurs and the crack is liable to occur.

On the contrary, in Examples 1 and 2, in a process of obtaining the compact, the under coat layer is formed in advance on the base material where the slurry made of a desired material is subjected to the magnetic field treatment. Further, it is preferred that a magnetic material be contained in a raw material of the first slurry used for the under coat layer. It is further preferred that the magnetic material be Mn.

In the manufacturing method of Examples 1 and 2, the crack appearing in Comparative Example 1 did not occur, and a high-quality tungsten bronze structure metal oxide was obtained. This mechanism is supposed as follows. With the formation of the under coat layer made of the first slurry in Examples 1 and 2, the under coat layer serves as the layer solidified on the bottom surface while the layer is not sufficiently oriented. Further, in the obtained compact, the boundary surface 5 was formed on an interface between the under coat layer and the tungsten bronze structure metal oxide having a desired composition, which was formed on the under coat layer. In Example 1, the boundary surface 5 was in the vicinity of a surface ground from the bottom surface by 1.2 mm as illustrated in FIG. 4, and the position was set to a reference point of 0 mm. Further, in Example 2, as illustrated in FIG. 5, the boundary surface 5 was in the vicinity of a surface ground from the bottom surface by 1.2 mm, and the position was set to a reference point of 0 mm. The stress can be confined to the under coat layer that is finally made redundant because a shear force caused by a contraction difference occurring in the drying process and the sintering process is concentrated in the discontinuous boundary surface. The under coat layer can thus be peeled off and separated from the bottom surface. In this way, from the tungsten bronze structure metal oxide made of the second slurry having the desired composition, the compact and the sintered body that hold the uniform orientation can be obtained.

As in Example 2, when Mn as a magnetic material was contained in the second slurry of the under coat layer, as illustrated in FIG. 5, the orientation was already high on the under coat layer side with respect to the boundary surface, and as a result, the tungsten bronze structure metal oxide made of the desired second slurry and having a high orientation further excellent in the uniformity was provided.

Conceivably, this is because the magnetic susceptibility of the first slurry was accelerated by addition of Mn, and the under coat layer was more oriented than that without addition of Mn, and even if the boundary surface was discontinuous, information on the orientation was trailed.

TABLE 2

|  | Degree of orientation F (%) | $d_{33}$ (pC/N) | Outer appearance |
|---|---|---|---|
| Example 3 | 17 | 280 | Good |
| Example 4 | 29 | 311 | Good |
| Comparative Example 2 | 5 | 212 | No good |
| Comparative Example 3 | 12 | 256 | No good |

Table 2 shows the results of the degree of orientation F, the piezoelectric constant $d_{33}$, and the outer appearance evaluation of a pellet of barium titanate $BaTiO_3$-based material which is the perovskite-type structure metal oxide in Examples 3 and 4. Further, in the outer appearance, "no good" represents that a crack is observed, and "good" represents that no crack occurs.

As a result, in the $BaTiO_3$-based material low in crystal anisotropy, the degree of orientation F was about 20% and 30% in Examples 3, and 4, respectively. As a result of the orientation uniformity evaluation, the boundary surface was provided as in Examples 1 and 2. On the contrary, the degree of orientation F was about 5% and 10% in Comparative Examples 1 and 2 that were the conventional art, respectively. As a result of the orientation uniformity evaluation, as in Comparative Example 1, no boundary surface was provided, and the continuous orientation inclination occurred. The evaluation results of $d_{33}$ of the piezoelectricity were 280 pC/N and 311 pC/N in Examples 3 and 4, respectively, and 212 pC/N and 256 pC/N in Comparative Examples 2 and 3, respectively, which were results based on the degree of orientation. The outer appearance had no crack and was good in Examples 3 and 4, but had the cracks in Comparative Examples 2 and 3.

The manufacturing method according to the present invention can be applied as a method of manufacturing a functional ceramic material that has no crack and is excellent in sintering property while maintaining the high orientation.

This application claims the benefit of Japanese Patent Application No. 2010-102699, filed Apr. 27, 2010, which is hereby incorporated by reference herein in its entirety.

The invention claimed is:

1. A method of manufacturing ceramics, comprising:
    placing, on a base material, a first slurry in which a metal oxide powder containing at least metal elements constituting the ceramics is dispersed;
    applying a magnetic field to the first slurry to solidify the first slurry, thereby forming an under coat layer made of a first compact;
    placing, on the under coat layer, a second slurry containing a metal oxide powder constituting the ceramics;
    applying a magnetic field to the second slurry to solidify the second slurry, thereby forming a second compact to obtain a laminated body of the second compact and the under coat layer; and
    obtaining the ceramics made of the second compact by one of removing the under coat layer from the laminated body of the second compact and the under coat layer and then sintering the second compact, and sintering the laminated body of the second compact and the under coat layer and then removing the under coat layer.

2. The method of manufacturing ceramics according to claim 1, wherein the metal oxide powder of the first slurry has a magnetic anisotropy.

3. The method of manufacturing ceramics according to claim 1, wherein the metal oxide powder of the first slurry contains a magnetic metal element.

4. The method of manufacturing ceramics according to claim 1, wherein the first slurry contains Mn.

5. The method of manufacturing ceramics according to claim 1, wherein the first compact and the second compact are oriented in an identical crystal axis.

6. The method of manufacturing ceramics according to claim 1, wherein the ceramics comprises a tungsten bronze structure metal oxide.

7. The method of manufacturing ceramics according to claim 1, wherein the ceramics comprises a perovskite-type metal oxide.

8. The method of manufacturing ceramics according to claim 7, wherein a main component of the perovskite-type metal oxide is barium titanate.

9. The method of manufacturing ceramics according to claim 1, wherein the magnetic field applied to the first slurry comprises a rotating magnetic field.

* * * * *